(12) United States Patent
Lin

(10) Patent No.: US 7,999,623 B2
(45) Date of Patent: Aug. 16, 2011

(54) DIGITAL FRACTIONAL-N PHASE LOCK LOOP AND METHOD THEREOF

(75) Inventor: Chia-Liang Lin, Fremont, CA (US)

(73) Assignee: Realtek Semiconductor Corp., Science Park, HsinChu (TW)

( * ) Notice: Subject to any disclaimer, the term of this patent is extended or adjusted under 35 U.S.C. 154(b) by 21 days.

(21) Appl. No.: 12/464,895

(22) Filed: May 13, 2009

(65) Prior Publication Data

US 2009/0231050 A1 Sep. 17, 2009

Related U.S. Application Data

(60) Continuation-in-part of application No. 12/353,846, filed on Jan. 14, 2009, which is a division of application No. 11/564,173, filed on Nov. 28, 2006, now Pat. No. 7,498,856.

(60) Provisional application No. 60/742,583, filed on Dec. 5, 2005, provisional application No. 61/052,997, filed on May 13, 2008, provisional application No. 61/053,596, filed on May 15, 2008.

(51) Int. Cl.
*H03L 7/01* (2006.01)

(52) U.S. Cl. ......... 331/16; 331/1 A; 331/25; 331/177 R; 327/156; 327/159

(58) Field of Classification Search .......... 331/1 A, 331/25, 177 R, 16; 327/156, 159
See application file for complete search history.

(56) References Cited

U.S. PATENT DOCUMENTS

| 6,836,526 | B2 | 12/2004 | Rana |
| 6,873,213 | B2 | 3/2005 | Tsuda |
| 6,960,947 | B2 | 11/2005 | Albasini |
| 7,183,860 | B2 | 2/2007 | Staszewski |
| 7,205,924 | B2 | 4/2007 | Vemulapalli |

FOREIGN PATENT DOCUMENTS

| TW | 429688 | 4/2001 |
| TW | 587371 | 5/2004 |
| TW | I226754 | 1/2005 |

*Primary Examiner* — Arnold Kinkead
(74) *Attorney, Agent, or Firm* — Winston Hsu; Scott Margo

(57) ABSTRACT

A method for reducing a phase noise in a digital fractional-N phase lock loop (PLL) is disclosed. The method comprises: quantifying a time difference between a reference clock and a feedback clock into a time difference signal; generating a residual error signal according to the time difference signal and an instantaneous error signal; filtering the residual error signal to generate a control code; controlling an oscillator using the control code to generate an output clock; receiving a fractional number between 0 and 1 to generate the instantaneous error signal; and dividing down the output clock by a divisor value according to the fractional number.

24 Claims, 4 Drawing Sheets

US 7,999,623 B2

DIGITAL FRACTIONAL-N PHASE LOCK LOOP AND METHOD THEREOF

CROSS REFERENCE TO RELATED APPLICATIONS

This application claims the benefits of a continuation-in-part of U.S. application Ser. No. 12/353,846, filed on Jan. 14, 2009 which claims the benefits of division of U.S. application Ser. No. 11/564,173, filed on Nov. 28, 2006 which claims U.S. Provisional Application No. 60/742,583, filed on Dec. 5, 2005, the benefits of U.S. Provisional Application No. 61/052,997, filed on May 13, 2008 and entitled "DIGITAL FRACTIONAL-N PHASE LOCK LOOP AND METHOD THEREOF" and U.S. Provisional Application No. 61/053,596, filed on May 15, 2008 and entitled "DIGITAL FRACTIONAL-N PHASE LOCK LOOP AND METHOD THEREOF", the contents of which are incorporated herein by reference.

BACKGROUND OF THE INVENTION

1. Field of the Invention

The present invention relates generally to digital fractional-N phase lock loop, and more particularly but not exclusively to method and apparatus for reducing phase noise of digital fractional-N phase lock loop.

2. Description of Related Art

A digital PLL (phase lock loop) receives a reference clock of a first frequency and generates accordingly an output clock of a second frequency, wherein the output clock is phase-locked to the reference clock and the second frequency is N times higher than the first frequency. As depicted in FIG. 1A, a typical digital PLL 100A comprises a TDC (time-to-digital converter) 110 for measuring a time difference between the reference clock REF of the first frequency and a feedback clock FB of a third frequency and generating accordingly a time difference signal TD for representing the time difference; a digital loop filter 120 for filtering the time difference signal TD (which is a digital signal) and generating a control code C; a DCO (digitally controlled oscillator) 130 for generating the output clock OUT of the second frequency in accordance with a value of the control code C; and a divide-by-N circuit 140A for generating the feedback clock FB of the third frequency by dividing down the output clock OUT of the second frequency with a divisor value of N. The second frequency, i.e. the frequency of the output clock OUT and also the oscillation frequency of DCO 130, is controlled by the value of the control code C. In an embodiment, the frequency of the output clock OUT (i.e. the second frequency, the oscillation frequency of the DCO 130) increases (decreases) in response to an increase (decrease) of the value of the control code C. Due to the divide-by-N function of the divide-by-N circuit 140A, the second frequency is N time higher than the third frequency. When the control code C is too small (large), the second frequency will be too low (high) and accordingly the third frequency will also be too low (high). In this case, the feedback clock FB will be too slow (fast) and thus trail (lead) the reference clock REF, resulting in a positive (negative) value of the time difference signal TD, indicating a positive (negative) time difference between the reference clock REF and the feedback clock FB. The digital loop filter 130 usually includes an integration function. A positive (negative) value of the time difference signal TD leads to an increase (decrease) of the value of the control code C, thanks to the integration function of the digital loop filter 130. In this closed-loop manner, the control code C is adjusted (i.e. increased or decreased) to make the timing (i.e. frequency and phase) of the feedback clock FB tracks the timing of the reference clock REF. In a steady state where the control code C settles into a proper value, the mean value of the time difference signal TD must be zero (otherwise, the control code C will blow up and cannot be settled, thanks to the integration function of the digital loop filter 130). In the steady state, therefore, the third frequency must be equal to the first frequency, and consequently the second frequency must be N times higher than the first frequency since the second frequency is N time higher than the third frequency due to the divide-by-N divider circuit 140A.

The divide-by-N circuit 140A for the digital PLL 100A of FIG. 1A can be conveniently implemented using a divide-by-N counter if N is an integer. If N is not an integer, however, a straight implementation using a counter with a fixed divisor value will not work, since the divisor value of a counter always needs to be an integer. To implement a divide-by-N function for a non-integer N, say $N=N_{int}+\alpha$ where $N_{int}$ is an integer and $\alpha$ is a fractional number between 0 and 1, we need to shuffle the divisor value for the counter. For example, we may shuffle the divisor value between $N_{int}$ and $(N_{int}+1)$; the effective divisor value will be equal to $N_{int}+\alpha$ as long as the probability of having the divisor value of $(N_{int}+1)$ is $\alpha$ and the probability of having the divisor value of $N_{int}$ is $(1-\alpha)$. In prior art, a delta-sigma modulator is often used to dynamically shuffle the divisor value.

By embodying the divide-by-N circuit 140A of digital PLL 100A using embodiment circuit 140B resulting in a digital fractional-N PLL 100B shown in FIG. 1B. Embodiment circuit 140B comprises: a dual-modulus divider (DMD) 150 for generating the feedback clock FB by dividing down by dividing down the output clock OUT by a divisor value of either $N_{int}$ or $(N_{int}+1)$, depending on a value of a binary code CARRY; a DSM (delta-sigma modulator) 160 for receiving the fractional number $\alpha$ and modulating it into the binary code CARRY in accordance with a timing provided by the feedback clock FB. The purpose of DSM 160 is to generate the binary code CARRY in a manner such that CARRY is either 0, with a probability of $\alpha$, or 1, with a probability of $(1-\alpha)$, and the mean value of CARRY is equal to $\alpha$. In this manner, the feedback clock FB is divided-down from the output clock OUT by a divisor value shuffled between $N_{int}$ and $(N_{int}+1)$ with a mean value of $N_{int}+\alpha$.

Shuffling the divisor value for the divide-by-N circuit effectively achieves a fractional-N division. In this case, in the steady state, the mean timing difference between the reference clock REF and the feedback clock FB (i.e. the mean value of the time difference signal TD) is still zero, but the instantaneous timing difference is not zero and can be almost as large as $T_{DCO}/2$, where $T_{DCO}$ denotes a cycle period of the output clock OUT, due to the shuffling of the divisor value between $N_{int}$ and $(N_{int}+1)$. The instantaneous timing difference leads to instantaneous noise in the time difference signal TD, resulting in a noise in the control code C and thus a phase noise in the output clock OUT.

Besides the phase noise due to the shuffling of the divisor value, non-idealities of the TDC 110 (of either FIG. 1A or FIG. 1B) also contribute to the phase noise in the output clock OUT. As depicted in FIG. 1C, the time difference signal TD should be proportional to the time difference between the reference clock REF and the feedback clock FB, as demonstrated by the dashed straight line 170. In practice, however, the transfer characteristics of a TDC will likely deviate from the dashed straight line 170, as exemplified by a curved line 180. The deviation from an ideal straight line effectively introduces an error into the time difference signal TD and therefore contributes to the phase noise in the output clock OUT.

What is needed is a method to cancel the phase noise caused by both the shuffling of the value of the divisor and the non-idealities of the TDC.

BRIEF SUMMARY OF THIS INVENTION

In an embodiment, a digital fractional-N phase lock loop (PLL) is disclosed, the digital fractional-N PLL comprising: a time-to-digital converter (TDC) for measuring a time difference between a reference clock and a feedback clock to generate a time difference signal to represent the time difference; a summation circuit for subtracting from the time difference signal a predicted error signal to generate a residual error signal; a digital loop filter for filtering the residual error signal to generate a control code; a digitally controlled oscillator (DCO) for generating an output clock in accordance with a control by the control code; a divider circuit for dividing down from the output clock with a divisor value controlled by a carry signal to generate the feedback clock; a delta-sigma modulator (DSM) working synchronously with the feedback clock for receiving a fractional number between 0 and 1 to generate the carry signal and an instantaneous error signal; an adaptive series expansion function for mapping the instantaneous error signal into the predicted error signal.

In an embodiment, a method for reducing a phase noise in a digital fractional-N phase lock loop (PLL) is disclosed, the method comprising: quantifying a time difference between a reference clock and a feedback clock into a time difference signal; subtracting from the time difference signal a predicted error signal to generate a residual error signal; filtering the residual error signal to generate a control code; controlling a digitally controlled oscillator (DCO) using the control code to generate an output clock; dividing down the output clock by a divisor value in accordance with a carry signal; generating the carry signal and an instantaneous error signal by performing a delta-sigma modulation on a fractional number between 0 and 1; using an adaptive series expansion comprising a linear combination of a plurality of basis functions with respective coefficients for mapping the instantaneous error signal into the predicted error signal; and adapting each of said coefficients based on a correlation either between a respective basis function and the residual signal or between the respective basis function and the time difference signal.

DETAILED DESCRIPTION OF THIS INVENTION

The present invention relates to digital fractional-N phase lock loop (PLL), in particular to digital fractional-N PLL with phase noise cancellation. While the specifications described several example embodiments of the invention considered best modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1A:
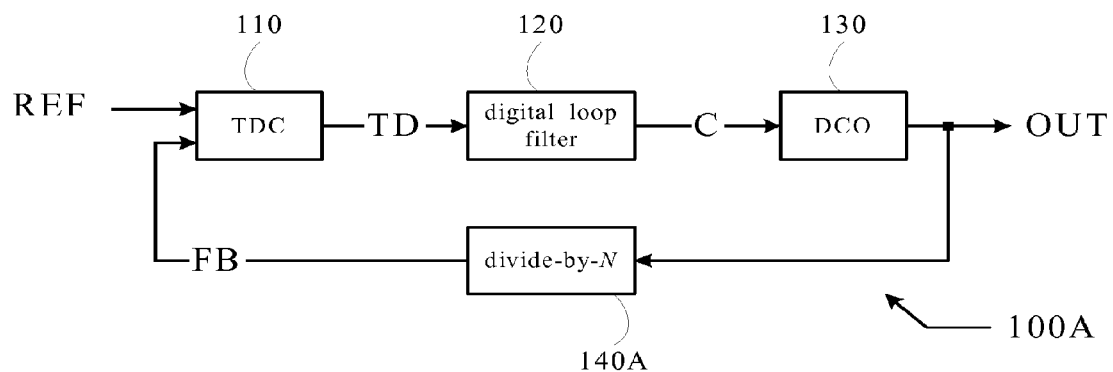
FIG. 1A shows a prior art digital PLL.
Figure 1B:
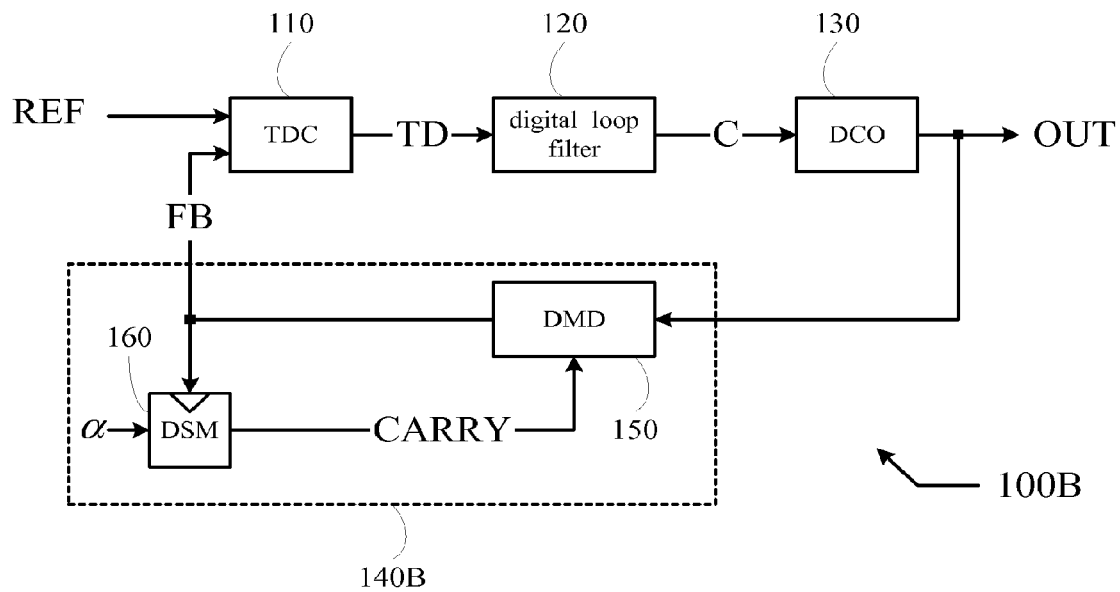
FIG. 1B shows a prior art digital fractional-N PLL.
Figure 1C:
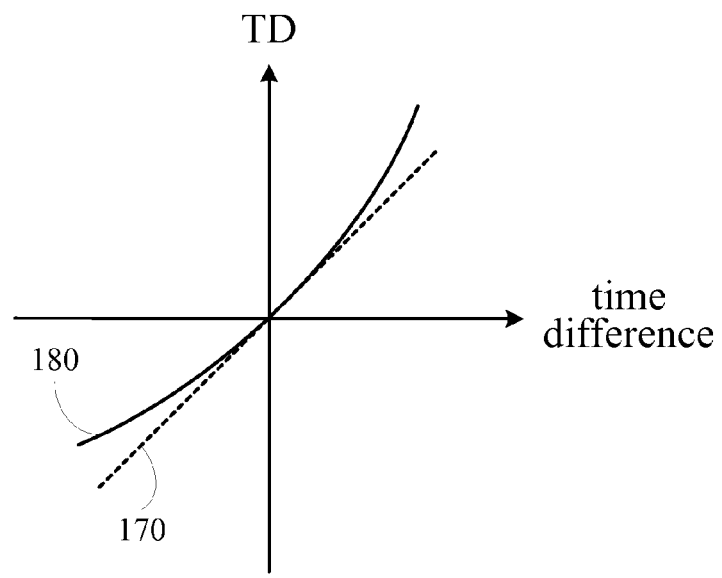
FIG. 1C shows exemplary transfer characteristics of a time-to-digital converter.

Still refer to FIG. 1B. In the typical digital fractional-N PLL 100B, the fractional-N division function is effectively fulfilled by shuffling the divisor value of the dual-modulus divider DMD 150, but the shuffling leads to an instantaneous error in a time difference between the reference clock REF and the feedback clock FB. The instantaneous error in the time difference is measured and digitized by the time-to-digital conversion TDC 110. However, TDC 110 is usually non-ideal and therefore a distortion is likely further introduced at the output of TDC 110. This present invention seeks to remove both the instantaneous error in the time difference and also the distortion due to the non-idealities of the TDC 110.

This present invention seeks to characterize the non-ideal transfer characteristics of a time-to-digital converter using a series expansion, i.e. a linear combination of a set of basis functions. In an exemplary but not exclusive embodiment, a Legendre polynomial series is used. A Legendre polynomials series comprises a linear combination of Legendre polynomials. The first few terms of Legendre polynomials are listed below:

$$P_0(x)=1 \qquad (1)$$

$$P_1(x)=x \qquad (2)$$

$$P_2(x)=(3x^2-1)/2 \qquad (3)$$

$$P_3(x)=(5x^3-3x)/2 \qquad (4)$$

$$P_4(x)=(35x^4-30x^2+3)/8 \qquad (5)$$

$$P_5(x)=(63x^5-70x^3+15x)/8 \qquad (6)$$

The Legendre polynomials are orthogonal over the interval $[-1, 1]$. To be specific, the following relation holds:

$$\int_{-1}^{1} P_m(x)P_n(x)dx = \frac{2}{2n+1}\delta_{mn} \qquad (7)$$

where $\delta_{mn}$ is the Kronecker-delta function, i.e.

$$\delta_{mn} = \begin{cases} 1 & m = n \\ 0 & m \ne n \end{cases} \qquad (8)$$

The Legendre polynomials can be used as a set of basis functions to represent the transfer characteristics of the time-to-digital converter. Let the instantaneous error in the time difference between the reference clock REF and the feedback clock FB be $\epsilon$, then we may represent the time difference signal TD (which is the output of the TDC) using a Legendre polynomial series expansion, i.e. a linear combination of the Legendre polynomials:

$$TD=c_0P_0(\epsilon)+c_1P_1(\epsilon)+c_2P_2(\epsilon)+c_3P_3(\epsilon)+c_4P_4(\epsilon)+c_5P_5(\epsilon)+\ldots \qquad (9)$$

In a digital fractional-N PLL using a delta-sigma modulator to shuffle the divisor value, the value of $\epsilon$, i.e. the instantaneous error in the time difference between the reference clock REF and the feedback clock FB, can be accurately predicted. If the expansion coefficients ($c_0$, $c_1$, $cc_2$, $c_3$, and so on) are also known, then the error in the time difference signal TD can also be accurately predicted and thus removed.

Figure 2A:
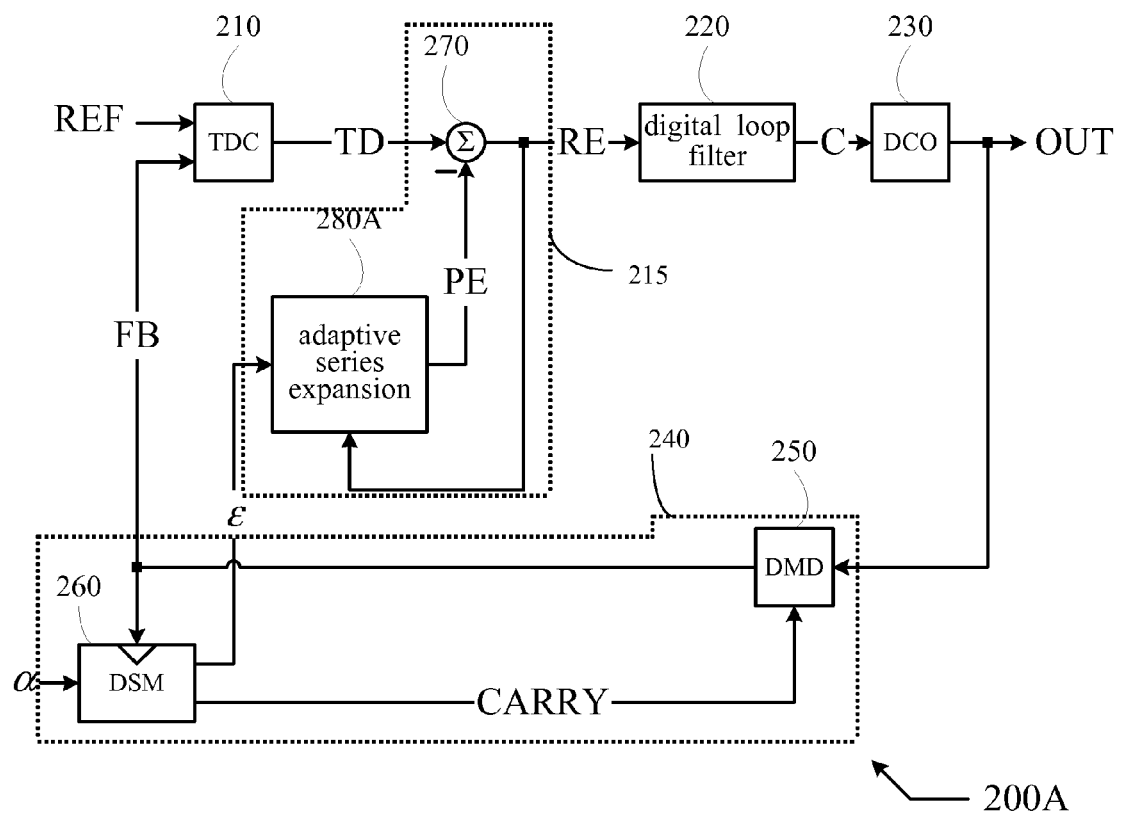
FIG. 2A shows an embodiment of a digital fractional-N PLL in accordance with the present invention.

A digital fractional-N PLL 200A in accordance with an exemplary embodiment of the present invention is depicted in FIG. 2A. Digital fractional-N PLL 200A comprises: TDC (time-to-digital converter) 210, a cancellation circuit 215, a digital loop filter 220, a DCO (digitally controlled oscillator) 230, and a divider circuit 240. In one embodiment, the cancellation circuit includes a summation circuit 270 and an adaptive series expansion functional block 280A. In one embodiment, the divider circuit includes a dual-modulus divider (DMD) 250 and a delta-sigma modulator (DSM) 260.

In an embodiment, TDC (time-to-digital converter) 210 for measuring a time difference between a reference clock REF and a feedback clock FB and generating accordingly a time difference signal TD (which is a digital signal) for representing the time difference. The summation circuit 270 is used for subtracting from the time difference signal TD a predicted error signal PE to generate a residual error signal RE. The digital loop filter 220 is used for filtering the residual error signal RE and generating a control code C. The DCO (digitally controlled oscillator) 230 is used for generating the output clock OUT in accordance with a value of the control code C. The dual-modulus divider (DMD) 250 is used for dividing down the output clock OUT into the feedback clock FB with a divisor value controlled by a binary signal CARRY. The delta-sigma modulator (DSM) 260 is used for modulating a fractional number $\alpha$ into the binary signal CARRY and generating an instantaneous error signal $\epsilon$ in accordance with a clocking provided by the feedback clock FB. The adaptive series expansion functional block 280A is used for receiving the instantaneous error signal $\epsilon$ and the residual error signal RE and generating the predicted error signal PE using the Legendre polynomial series expansion:

$$PE=\hat{c}_0 P_0(\epsilon)+\hat{c}_1 P_1(\epsilon)+\hat{c}_2 P_2(\epsilon)+\hat{c}_3 P_3(\epsilon)+\hat{c}_4 P_4(\epsilon)+\hat{c}_5 P_5(\epsilon)+\ldots \quad (10)$$

where the coefficients with hats denote the estimated coefficients for the Legendre polynomial series shown in equation (9). In an embodiment, the estimated coefficients are adapted based on a LMS (least mean square) algorithm:

$$\hat{c}_n^{(new)}=\hat{c}_n^{(old)}+\mu \cdot P_n(\epsilon) \cdot RE, \text{ for } n=0, 1, 2, 3, \ldots \quad (11)$$

where $\mu$ is an adaptation constant that needs to be sufficiently small to assure a convergence in the adaptation, the superscript "(old)" denotes an old value before an adaptation, and the superscript "(new)" denotes a new value after the adaptation. In practice, if the time difference signal TD is normalized with respect to $T_{DCO}/2$ (i.e. TD=±1 when the time difference between the reference clock REF and the feedback clock FB is $\pm T_{DCO}/2$ (where $T_{DCO}$ denotes a cycle period of the output clock OUT) and the instantaneous error signal $\epsilon$ is also normalized to be within the interval [−1, 1], then a typical number for $\mu$ is 0.01. A greater $\mu$ leads to faster convergence but larger adaptation noise. On the contrary, a smaller $\mu$ leads to slower convergence but smaller adaptation noise. In practice, $\mu$ can be set to be a larger value initially to facilitate the convergence but reduced to a smaller value after the convergence to reduce the adaptation noise. In an embodiment, all the estimated coefficients are set to zero initially and will not be adapted until the digital fractional-N PLL reaches a steady state condition. The steady state condition can be established by either a time-out of a timer (which is set in accordance with a typical time it takes for the digital fractional-N PLL to reach the steady state) or by confirming that the time difference signal TD consistently falls into the normalized time interval [−1, 1]. The adaptation can be performed either continuously or intermittently.

In a nutshell, in a typical embodiment, the adaptive series expansion functional block 280A of FIG. 2A receives the instantaneous error signal $\epsilon$ and the residual error signal RE and generates the predicted difference signal PE in accordance with equations (10) and (11), with the Legendre polynomials being defined by equations from (1) to (6). While the number of terms chosen for the Legendre polynomial expansion (see equation (10)) is specified at the discretion of circuit designers, usually 4 to 6 terms are good enough to characterize a practical time-to-digital converter with a satisfactory accuracy. Also, those of ordinary skill in the art may implement all those equations in any manner as long as the mathematical equivalence is preserved. For instance, one can convert a Legendre polynomial series into a Taylor series by collecting terms of the same order of power in the instantaneous error $\epsilon$ (i.e. collecting all $\epsilon$ terms, all $\epsilon^2$ terms, and all $\epsilon^3$ terms, and so on.)

Figure 2B:
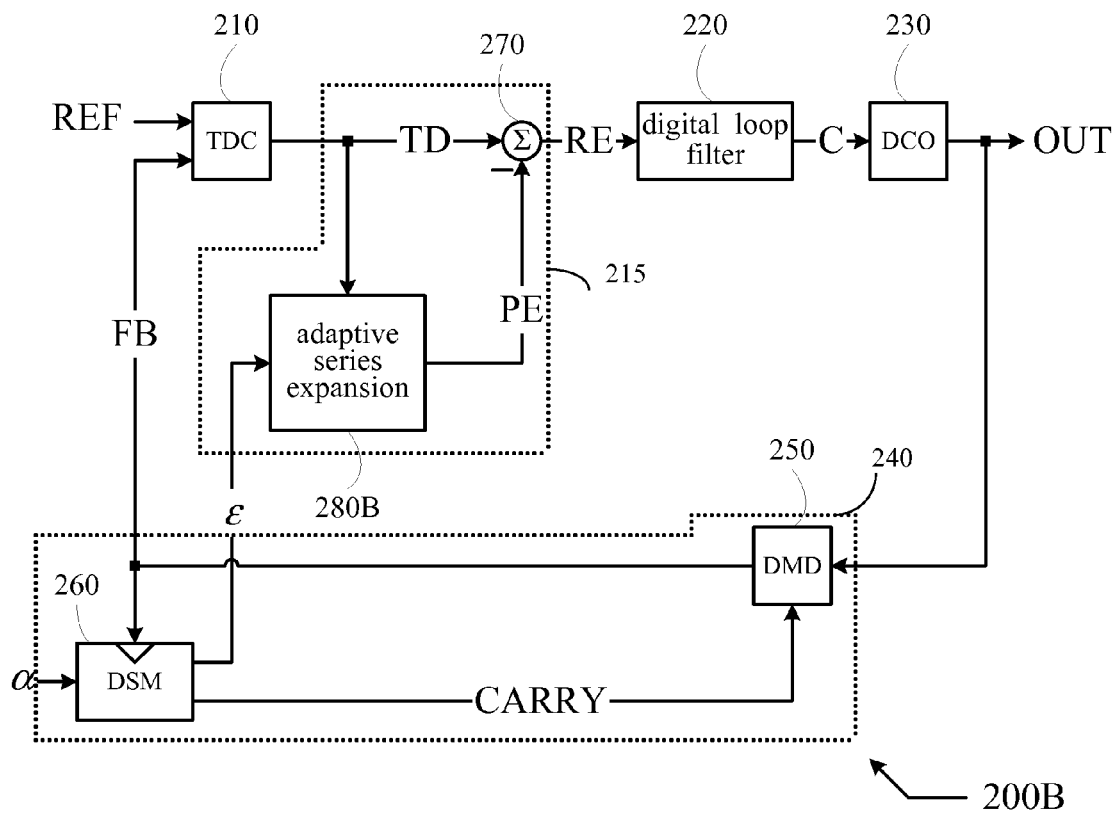
FIG. 2B shows an alternative embodiment of a digital fractional-N PLL in accordance with the present invention.

In an alternative embodiment 200B shown in FIG. 2B, the series expansion is adapted based on the time difference signal TD (instead of the residual error signal RE). Here, an alternative adaptive series expansion functional block 280B is used to replace the adaptive series expansion functional block 280A in the previous embodiment 200A of FIG. 2A. The same Legendre polynomial series (see equation (10)) is still applied to evaluate the predicted error signal PE, but the coefficients are adapted using the following formula:

$$\hat{c}_n^{(new)} = \frac{\langle P_n(\varepsilon), TD \rangle}{\langle P_n(\varepsilon), P_n(\varepsilon) \rangle} \quad (12)$$

for n=0, 1, 2, 3, and so on, where $\langle A, B \rangle$ denotes a statistical average of A times B. In a nutshell, in this alternative embodiment, the adaptive series expansion functional block 280B of FIG. 2B receives the instantaneous error signal $\epsilon$ and the time difference signal TD and generates the predicted error signal PE in accordance with equations (10) and (12), with the Legendre polynomials being defined by equations from (1) to (6). Again, those of ordinary skill in the art may implement all those equations in any manner one desires as long as the mathematical equivalence is preserved. Also, note that the denominator of equation (12) is a pre-known constant and thus does not need to be numerically evaluated. If the instantaneous error signal $\epsilon$ is normalized to be within the interval [1, −1], for instance, then one know for sure without performing numerical evaluation that $$\frac{1}{\langle P_n(\varepsilon), P_n(\varepsilon) \rangle} = \frac{2n+1}{2} \quad (13)$$

based on the orthogonal property shown in equation (7). In an embodiment, all the estimated coefficients are set to zero initially and will not be adapted until the digital fractional-N PLL reaches a steady state condition. Again, the adaptation (see equation (12)) can be performed either continuously or intermittently.

Embodiment of time-to-digital converter (TDC 210 in either FIG. 2A or 2B) is already known in prior art and thus not described in detail here. Embodiment of digitally controlled oscillator (DCO 230 in either FIG. 2A or 2B) is also known in prior art and thus not described in detail here. Those who are not familiar with TDC may refer to U.S. Pat. No. 7,205,924. Those who are not familiar with DCO may refer to U.S. Pat. No. 7,183,860.

Digital loop filter 220 can be chosen for a desired filtering response at the discretion of circuit designers. In an exemplary embodiment, digital loop filter 220 implements the following discrete-time system response:

$$H(z)=K_P z^{-1}+K_I z^{-1}/(1-z^{-1}) \qquad (14)$$

where $K_P$ and $K_I$ are two parameters to be specified by circuit designers.

Dual-modulus divider (DMD) 250 is a counter-based divider with a divisor value of either $N_{int}$ (when CARRY is 1) or $N_{int}+1$ (when CARRY is 0), where $N_{int}$ is the integer part of the fractional division ratio of the digital PLL (200A or 200B). Counter-based DMD circuit embodiment is well known to those of ordinary skill in the art of phase lock loop and thus not described in detail here.

Figure 3:
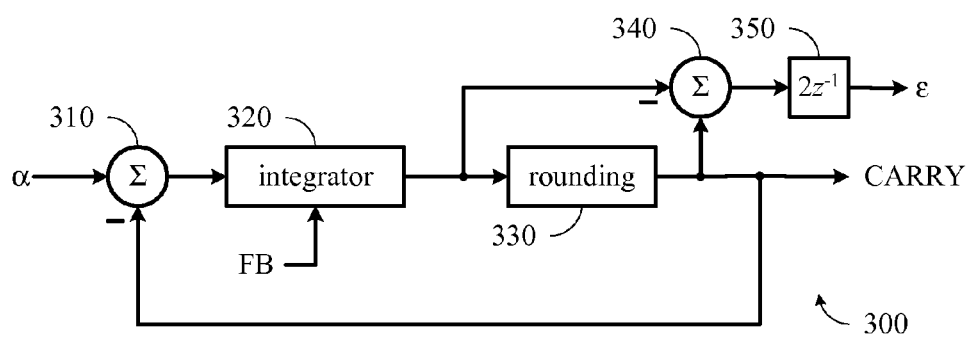
FIG. 3 shows a delta-sigma modulator suitable for the digital fractional-N PLL of FIG. 2A and the digital fractional-N PLL of FIG. 2B.

FIG. 3 depicts a delta-sigma modulator 300 suitable for embodying DSM 260 (for either embodiment 200A in FIG. 2A or 200B in FIG. 2B). Modulator 300 operates synchronously with the feedback clock FB. Modulator 300 comprises: a first summation circuit 310, an integrator 320, a rounding operator 330, a second summation circuit 340, and a gain/delay element 350. DSM 300 is basically an accumulator for accumulating the fractional number α (where 0<α<1) using the integrator 320. The accumulated amount is rounded by the rounding operator 330 to generate the CARRY signal. When the accumulated amount exceeds 0.5, the CARRY signal is 1 and an amount of −1 is deducted from the accumulator using the first summation circuit 310. When the accumulated amount does not exceed 0.5, the CARRY signal is 0 and no amount needs to be deducted from the accumulator. In this manner, the accumulator amount is controlled to be within the interval [−0.5, 0.5] and the CARRY signal is either 0 or 1. The instantaneous error signal ε is generated by calculating the difference between the output and the input of the rounding operator 330 using the second summation circuit 340, and then delaying and scaling the difference using the gain/delay element 350. In the notation of the gain/delay element 350 shown in FIG. 3, the factor $z^{-1}$ denotes a unit delay and the factor 2 is a gain factor to ensure the resultant instantaneous error ε is normalized to within the interval [−1, 1].

The present invention can be practiced in various alternative embodiments without departing from the scope of the present invention. For instance, a higher order DSM can be used. In this case, the CARRY signal is a not a binary signal but a multi-level integer signal, and the dual-modulus divider needs to be replaced by a multi-modulus divider. Instead of using Legendre polynomial series, other types of series expansion can be used, too. For instance, one may choose to use Taylor series, Fourier series, and so on. Those of ordinary skill in the art of applied mathematics can choose a proper series expansion at their discretion without departing from the scope of the art. When choosing a Taylor series, for instance, all one needs to do is to replace the Legendre polynomial function $P_n(x)$, defined in equations (1)-(6) for n=0 to 5, with a simple power function $P'_n(x)=x^n$ for n=0 to 5, respectively. However, it must be noted that power functions are not orthogonal to each other. That is, $P'_n(x)=x^n$ is not orthogonal to $P'_m(x)=x^m$ if n is not equal to m. (Two functions are orthogonal to each other if there is zero statistical correlation between them.) In this case, the embodiment 200B of FIG. 2B combined with using equation (12) for adaptation is not suitable, since equation (12) is based on orthogonal property and is suitable only when the basis functions for expansion are orthogonal. However, embodiment 200B of FIG. 2B can still be used, as long as an alternative adaptation involving Gram-Schmidt orthonormalization is applied. Gram-Schmidt orthonormalization is well known to those skilled in mathematics and thus not described in detail here. Those who are not familiar with it should refer to standard mathematics texts. In any case, it is recommended that orthogonal functions are used for series expansion when choosing embodiment 200B of FIG. 2B.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
a time-to-digital converter (TDC) for converting a time difference between a reference clock and a feedback clock into a time difference signal;
a cancellation circuit for receiving the time difference signal and generating a residual error signal according to the time difference signal and an instantaneous error signal, comprising:
a series expansion for mapping the instantaneous error signal into a predicted error signal; and
a summation circuit for subtracting from the time difference a predicted error signal to generate the residual error signal;
a digital loop filter for filtering the residual error signal to generate a control code; a digitally controlled oscillator (DCO) for generating an output clock in accordance with a control by the control code; and
a divider circuit for receiving a fractional number between 0 and 1 to generate the instantaneous error signal, and for dividing down from the output clock with a divisor value controlled by the fractional number to generate the feedback clock.

2. The apparatus of claim 1, wherein the series expansion is adapted to minimize a correlation between the instantaneous error signal and the residual error signal.

3. The apparatus of claim 1, wherein the series expansion is adapted by calculating a correlation between the time difference signal and the instantaneous error signal.

4. The apparatus of claim 1, wherein the series expansion is a power series with adaptive coefficients.

5. The apparatus of claim 4, wherein the adaptive coefficients are adapted based on a LMS (least mean square) algorithm.

6. The apparatus of claim 1, wherein the series expansion is a Legendre polynomial series with adaptive coefficients.

7. The apparatus of claim 6, wherein the adaptive coefficients are adapted based on a LMS (least mean square) algorithm.

8. The apparatus of claim 1, wherein the divider circuit comprises: a delta-sigma modulator (DSM) for receiving the fractional number to generate a carry signal and the instantaneous error signal; and a divider for dividing down from the output clock with a divisor factor controlled by the carry signal.

9. The apparatus of claim 8, wherein the delta-sigma modulator (DSM) works synchronously with the feedback clock.

10. The apparatus of claim 8, wherein the divisor value is a first integer when the carry signal is logically 1 and is a second integer when the carry signal is logically 0.

11. The apparatus of claim 8, wherein the delta-sigma modulator comprises at least an integrator.

12. The apparatus of claim 11, wherein the delta-sigma modulator comprises a rounding circuit.

13. A method for reducing a phase noise in a digital fractional-N phase lock loop (PLL), the method comprising:
quantifying a time difference between a reference clock and a feedback clock into a time difference signal;
generating a residual error signal according to the time difference signal and an instantaneous error signal;
filtering the residual error signal to generate a control code;
controlling an oscillator using the control code to generate an output clock;
receiving a fractional number between 0 and 1 to generate the instantaneous error signal;
dividing down the output clock by a divisor value according to the fractional number; and
generating a carry signal and the instantaneous error signal by performing a delta-sigma modulation on the fractional number; and wherein the divisor value corresponds to the carry signal.

14. The method of claim 13, wherein the step of generating the residual error signal further comprising: using an series expansion comprising a linear combination of a plurality of basis functions with respective coefficients for mapping the instantaneous error signal into the predicted error signal.

15. The method of claim 14, wherein the step of generating the residual error signal further comprising: adapting each of said coefficients based on a correlation either between a respective basis function and the residual error signal or between the respective basis function and the time difference signal.

16. The method of claim 14, wherein the series expansion is a power series.

17. The method of claim 14, wherein the series expansion is a Legendre polynomial series.

18. An apparatus comprising:
a time-to-digital converter (TDC) for converting a time difference between a reference clock and a feedback clock into a time difference signal;
a cancellation circuit for receiving the time difference signal and generating a residual error signal according to the time difference signal and an instantaneous error signal;
a digital loop filter for filtering the residual error signal to generate a control code; a digitally controlled oscillator (DCO) for generating an output clock in accordance with a control by the control code; and
a divider circuit for receiving a fractional number between 0 and 1 to generate the instantaneous error signal, and for dividing down from the output clock with a divisor value controlled by the fractional number to generate the feedback clock, comprising:
a delta-sigma modulator (DSM) for receiving the fractional number to generate a carry signal and the instantaneous error signal; and
a divider for dividing down from the output clock with a divisor factor controlled by the carry signal.

19. The apparatus of claim 18, wherein the delta-sigma modulator (DSM) works synchronously with the feedback clock.

20. The apparatus of claim 18, wherein the divisor value is a first integer when the carry signal is logically 1 and is a second integer when the carry signal is logically 0.

21. The apparatus of claim 18, wherein the delta-sigma modulator comprises at least one of at least an integrator and a rounding circuit.

22. A method for reducing a phase noise in a digital fractional-N phase lock loop (PLL), the method comprising:
quantifying a time difference between a reference clock and a feedback clock into a time difference signal;
generating a residual error signal according to the time difference signal and an instantaneous error signal, comprising:
using an series expansion comprising a linear combination of a plurality of basis functions with respective coefficients for mapping the instantaneous error signal into the predicted error signal;
filtering the residual error signal to generate a control code;
controlling an oscillator using the control code to generate an output clock;
receiving a fractional number between 0 and 1 to generate the instantaneous error signal; and
dividing down the output clock by a divisor value according to the fractional number.

23. The method of claim 22, wherein the step of generating the residual error signal further comprising: adapting each of said coefficients based on a correlation either between a respective basis function and the residual error signal or between the respective basis function and the time difference signal.

24. The method of claim 23, wherein the series expansion comprises one of a power series and a Legendre polynomial series.

* * * * *